United States Patent [19]

Hartsough

[11] 4,204,936

[45] May 27, 1980

[54] METHOD AND APPARATUS FOR ATTACHING A TARGET TO THE CATHODE OF A SPUTTERING SYSTEM

[75] Inventor: Larry D. Hartsough, Berkeley, Calif.

[73] Assignee: The Perkin-Elmer Corporation, Norwalk, Conn.

[21] Appl. No.: 25,226

[22] Filed: Mar. 29, 1979

[51] Int. Cl.² .............................................. C23C 15/00
[52] U.S. Cl. .................................. 204/192 R; 204/298
[58] Field of Search ........................... 204/192 R, 298

[56] References Cited

U.S. PATENT DOCUMENTS

| | | | |
|---|---|---|---|
| 3,216,652 | 11/1965 | Knauer | 230/69 |
| 3,878,085 | 4/1975 | Corbani | 204/298 |
| 4,060,470 | 11/1977 | Clarke | 204/192 R |
| 4,116,806 | 9/1978 | Love et al. | 204/298 |

OTHER PUBLICATIONS

E. M. DaSilva, Sputtering Cathode Holder with Interchangable Targets, IBM Technical Disclosure Bulletin, vol. 14, No. 1, (June 1971), pp. 221-222.
Brochure: "2400-85A Planar Magnetron Sputtering System", Perkin-Elmer, Ultek, Inc., Palo Alto, Ca., 3/1977.

*Primary Examiner*—John H. Mack
*Assistant Examiner*—William Leader
*Attorney, Agent, or Firm*—S. A. Giarratana; F. L. Masselle; E. T. Grimes

[57] ABSTRACT

An improved method and apparatus for attaching a target to the cathode of a cathode sputtering system is disclosed which includes a ferromagnetic retainer which releasably clamps the target to the cathode by virtue of its attraction to existing permanent magnets in the cathode assembly. An optional ferromagnetic ring may also be provided around the periphery of the target to further hold the target to the cathode assembly.

17 Claims, 3 Drawing Figures

METHOD AND APPARATUS FOR ATTACHING A TARGET TO THE CATHODE OF A SPUTTERING SYSTEM

BACKGROUND OF THE INVENTION

1. Field of the Invention

This invention relates generally to cathode sputtering systems and more particularly to the attachment of a target to the cathode assembly of a sputtering system.

2. Description of the Prior Art

A cathode sputtering system is primarily used to deposit thin films of material upon substrates. Extensively used in the electronic industry, a sputtering system often includes an evacuable chamber, a cathode assembly and an anode assembly disposed within the chamber, and a target attached to the cathode assembly. The target is formed of the same material which is to be deposited upon the chosen substrate.

In use, a substrate is placed within the chamber, the chamber is partially evacuated and backfilled with an inert gas and a high voltage power supply is activated to develop a potential between the cathode and anode. The potential causes gas ions to accelerate toward the cathode assembly and to strike the target material with sufficient momentum to cause the target to partially vaporize. The vaporized target material diffuses throughout the chamber and deposits as an even coat upon the substrate.

In many modern cathode sputtering systems, permanent magnets are included within the structure of the cathode assembly so that lines of magnetic flux extend through the target material to form a "tunnel" shaped path along the surface of the target. The flux line tunnel substantially traps electrons, which interact with the gas to create the aforementioned ions. Thus, the ion density adjacent the target is greatly increased, resulting in high sputtering rates from the target.

In the prior art, targets were either brazed or soldered to the backing plate of the cathode assembly. Such attachments had the advantage of firmly retaining the target in position on the cathode assembly and further provided good thermal conduction from the target to the cathode assembly so that as the target became heated, the heat would be drawn from the target by the cathode assembly.

When a target is soldered or brazed to a cathode assembly, however, the problem of later removing the target is created. If, for instance, an operator wished to remove a worn out or defective target, or if the operator wished to replace the target with a target of different composition, a long and tedious target removal operation would be required. Furthermore, during the removal operation, the expensive targets are sometimes destroyed. Also, the time required for soldering or brazing a new target onto the backing plate is further inefficient and costly.

SUMMARY OF THE INVENTION

A major object of this invention is to provide a method and apparatus for attaching a target to the cathode assembly of a sputtering system so that it can be quickly, safely, easily installed and removed.

Another object of this invention is to provide an improved method for transferring heat from the target to the cathode assembly.

Briefly, the invention comprises a ferromagnetic retainer which can firmly hold a target to a backing plate of a cathode assembly by virtue of its magnetic attraction to the permanent magnets or electromagnets forming a part of the cathode assembly. Preferably, at least a portion of the retainer extends through the target to engage a suitably configured recess in the backing plate so as to accurately align the target with the cathode assembly. The retainer is usually provided with an axial bore which is adapted to engage with a retainer removal tool.

Furthermore, in one embodiment of this invention a ferromagnetic ring is disposed within a circumferential slot formed in the target material. The ferromagnetic ring further helps to hold the target against the backing plate.

An advantage of this invention is that targets can be quickly and easily attached to and removed from a backing plate of a cathode assembly.

Another advantage of this invention is that the target is not destroyed with its removal from the backing plate and thus may be reused at a later time.

These and other objects and advantages of the present invention will no doubt become apparent upon a reading of the following detailed description as accompanied by the several figures of the drawing.

IN THE DRAWINGS

DETAILED DESCRIPTION OF THE PREFERRED EMBODIMENTS

Figure 1:
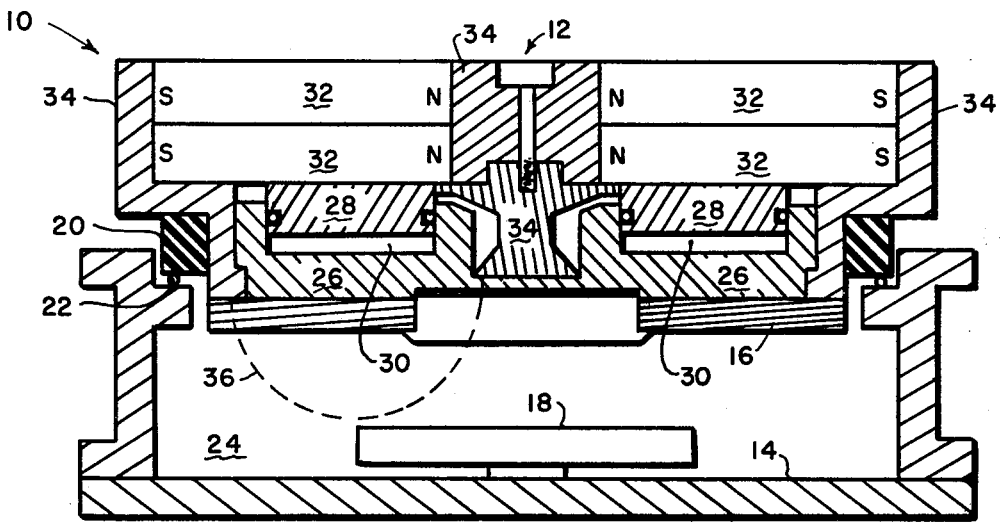
FIG. 1 is a partial cross-sectional view of a cathode sputtering system in accordance with the present invention.

In FIG. 1, a cathode sputtering system 10 is shown to include a cathode assembly 12, an anode assembly 14, a target 16, and a substrate 18 which is to be coated. An insulator 20 and O-ring 22 form a gas-tight fit between the cathode assembly 12 and the anode assembly 14 but electrically insulates the two assemblies from one another. In this embodiment, the cathode assembly and the anode assembly coact to define an evacuable region of space 24 within which substrate 18 resides.

Cathode assembly 12 includes a backing plate 26, a top cap 28 spaced from the backing plate so as to define water passageways 30, a plurality of permanent magnets 32, and a number of pole pieces 34. The pole pieces cause the flux produced by the bar magnets to be directed through target 16 in a pattern as indicated by broken line 36. These flux lines form a "tunnel" to trap most of the electrons produced by the sputtering process so that the ionization process is made more efficient.

Figure 2:
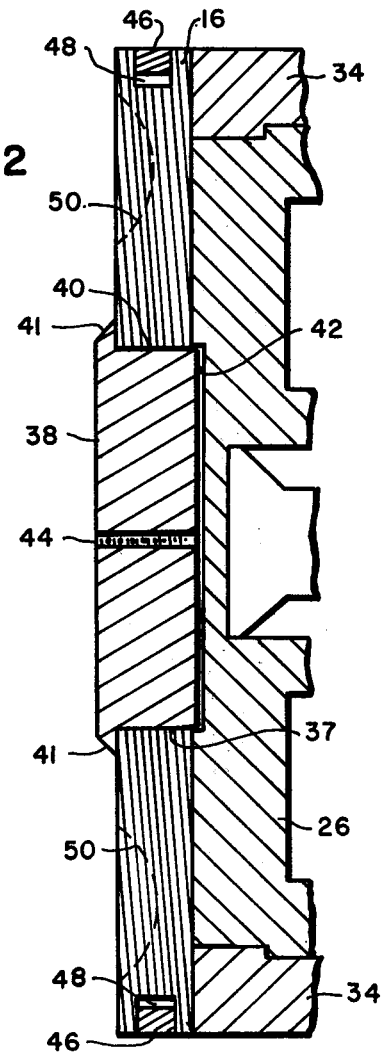
FIG. 2 is a partial cross-sectional view of the cathode assembly shown in FIG. 1.

Referring now additionally to FIG. 2, the novel method of attaching target 16 to backing plate 26 may be discussed. The target is placed against the backing plate and the body 37 of a ferromagnetic retainer 38 is engaged with an aperture 40 formed through the target while a lip 41 of the retainer engages the upper surface of the target. As seen in FIG. 1, the lines of magnetic flux 36 pass through the retainer 38 to strongly attract the retainer to the cathode assembly. It has been found that by using a three inch diameter retainer, a holding force of approximately twelve pounds may be achieved.

It will be noted that body 37 of the retainer extends through aperture 40 to engage a recess 42 machined into the surface of backing plate 26. Recess 42 centers retainer 38 on the backing plate and thus accurately aligns target 16 with the cathode assembly.

In FIG. 2, it will be noted that retainer 38 is provided with a threaded bore 44. A threaded retainer removal tool (not shown) can engage threaded bore 44 to simplify the removal of the retainer from backing plate.

Also seen in FIG. 2 is a cross-section of a ferromagnetic ring 46 which is disposed within a groove 48 formed circumferentially around the periphery of target 16. The ferromagnetic ring further serves to hold the target against the backing plate and is particularly necessary if the target is allowed to erode through so as to prevent pieces of the target from falling into chamber 24.

Also seen in FIG. 2 is the erosion area 50 of the target. As the sputtering process progresses, area 50 will slowly enlarge. It should be noted that both retainer 38 and ring 46 are outside of the area of erosion and thus do not introduce contamination by their presence.

Figure 3:
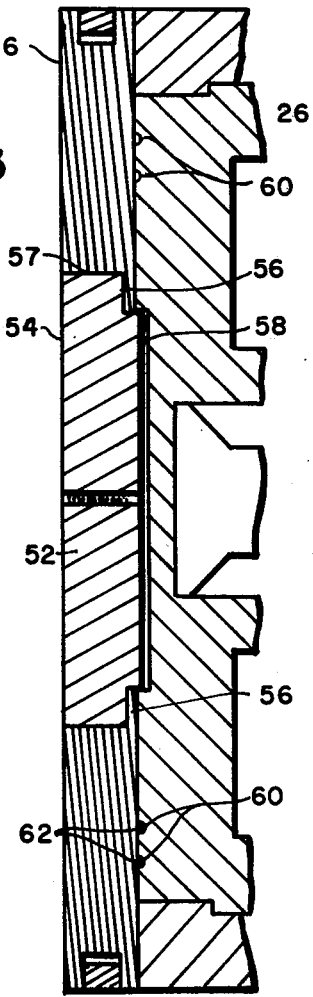
FIG. 3 is a partial cross-sectional view of an alternate embodiment for the cathode assembly shown in FIG. 1.

In FIG. 3, a slightly different alternate embodiment of the retainer is shown at 52. In this embodiment, the upper surface 54 of the retainer is formed flat with the outer surface of a target 16. Instead of having a lip (such as lip 41 of FIG. 2), retainer 52 is configured so as to engage with a step 56 formed within an aperture 57 that extends through the target material. As in the previous embodiments, the end of retainer 52 engages a recess 58 machined into the surface of backing plate 26.

It will be remembered that, in the discussion of FIG. 1, water passageways 30 were briefly mentioned. The passageways form a portion of a cooling jacket which draws heat from backing plate 26 and thus away from target 16. It is extremely important to draw heat from target 16 as the sputtering process loses efficiency as the temperature of the target rises. Furthermore, the magnetic attraction between retainer 38 and the cathode assembly diminishes as the temperature of the retainer approaches its Curie temperature. In view of the importance of heat transfer from the target to the backing plate, this invention contemplates at least two preferred methods for maximizing such a transfer.

A first method of maximizing heat transfer is utilized with a cathode assembly such as that illustrated in FIG. 2. The backing plate 26, which is formed of a non-magnetic conductor (such as copper) is plated with a thin layer of nickel and the portions of target 16 that contact the backing plate are coated with a thin layer of eutectic solder. The solder, even when melted by the extreme temperatures found in the sputtering system, will not adhere to the nickel plating of the backing plate but will still provide an excellent heat transfer medium between the target and the backing plate.

In FIG. 3, another method for enhancing the heat transference between the target and the backing plate is illustrated. In this method a number of grooves 60 are formed upon the surface of backing plate 26 and lengths of indium wire 62 are placed in the grooves. When the target heats up to 150 degrees centigrade, the indium wires melt and the molten indium is drawn along the abutting surfaces of target 16 and backing plate 26 by capillary action. The indium again provides excellent heat transfer characteristics but does not bind the target to the backing plate. As an alternate choice, the grooves may be formed into the target.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

What is claimed is:

1. A method for attaching a target to a sputtering cathode assembly including a backing plate and a magnetic subassembly coupled to said backing plate, the method comprising the steps of,
   positioning a first surface of said target against a surface of said backing plate, and
   placing a ferromagnetic retainer against a second surface of said target so that said retainer is attracted to said magnetic subassembly means with sufficient force to firmly hold said target to said backing plate.

2. A method as recited in claim 1 further comprising the step of
   disposing a heat transferring material between facing surfaces of said target and said backing plate.

3. A method as recited in claim 2 wherein said step of disposing a heat transferring material includes
   forming a nickel coating on said surface of said backing plate and forming a eutectic solder coating on said first target surface prior to the positioning of said target against said backing plate.

4. a method as recited in claim 3 wherein said step of disposing a heat transferring material includes
   forming grooves in said surface of said backing plate and placing lengths of indium wire within said grooves prior to positioning said target against said backing plate.

5. A method as recited in claim 3 wherein said step of disposing a heat transferring material includes
   forming grooves in said first surface of said target and placing lengths of indium wire within said grooves prior to positioning said target against said backing plate.

6. A method as recited in claim 1 further comprising the step of
   placing a ferromagnetic ring around at least a portion of the periphery of said target so that said ring is attracted to said magnetic means.

7. In a cathode sputtering system including a cathode assembly having a backing plate and a magnetic subassembly coupled to said backing plate, a target having a first surface positioned against a surface of said backing plate, and retainer means for holding said target against said backing plate, an improved retaining means comprising
   a ferromagnetic retainer abutted against a second surface of said target so as to be attracted to said magnetic subassembly with sufficient force to firmly hold said target against said backing plate.

8. In a system as recited in claim 7 wherein
   said ferromagnetic retainer is provided with a bore adapted to engage with a removal tool.

9. In a system as recited in claim 7 wherein said improved retaining means further comprises
   a ferromagnetic ring disposed around at least a portion of the periphery of said target.

10. A cathode sputtering system comprising
    an anode assembly, a cathode assembly including a backing plate and a magnetic subassembly coupled to said backing plate, insulator means coupling said anode assembly and said cathode assembly together so as to define an evacuable chamber therebetween, means for developing an electric potential between said anode assembly and said cathode assembly, target means disposed within said chamber and having a first surface for abutment against a surface of said backing plate, and a ferromagnetic retainer for abutment against a second surface of said target means, said ferromagnetic retainer being magnetically attracted to said magnetic subassembly with sufficient force to firmly hold said target to said backing plate.

11. A cathode sputtering system as recited in claim 10 wherein said retainer extends through an aperture provided in said target means to engage a recess provided in said surface of said backing plate.

12. A cathode sputtering system as recited in claim 11 wherein said retainer is provided with a lip for engaging said second surface of said target means.

13. A cathode sputtering system as recited in claim 10 wherein said retainer is configured to engage a step in said aperture formed through said target means.

14. A cathode sputtering system as recited in claim 10 further comprising a ferromagnetic ring engaged with at least a portion of the periphery of said target means.

15. A cathode sputtering system as recited in claim 11 wherein said retainer is provided with a bore adapted to engage with a retainer removal tool.

16. A cathode sputtering system as recited in claim 10 further comprising at least one length of indium wire disposed within groove means formed into said surface of said backing plate.

17. A cathode sputtering system as recited in claim 10 wherein said surface of said backing plate is covered with a nickel plating, and said first surface of said target is at least partially covered with a eutectic solder.

* * * * *